(12) United States Patent
Pawlowski

(10) Patent No.: US 6,205,514 B1
(45) Date of Patent: Mar. 20, 2001

(54) SYNCHRONOUS SRAM HAVING GLOBAL WRITE ENABLE

(75) Inventor: J. Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/951,709

(22) Filed: Oct. 16, 1997

Related U.S. Application Data

(63) Continuation of application No. 08/540,581, filed on Oct. 5, 1995, now abandoned, which is a continuation-in-part of application No. 08/391,725, filed on Feb. 21, 1995, now Pat. No. 5,848,431.

(51) Int. Cl.[7] .................................................. G06F 12/00
(52) U.S. Cl. .................. 711/104; 711/2; 711/5; 711/169; 365/230.01; 365/230.03
(58) Field of Search .................. 711/2, 5, 104, 711/169, 135; 365/230.01, 230.03, 189.05, 233, 243, 254.4

(56) References Cited

U.S. PATENT DOCUMENTS

| | | | |
|---|---|---|---|
| 4,141,068 | 2/1979 | Mager et al. | 364/200 |
| 4,231,105 | 10/1980 | Schuller et al. | 364/900 |
| 4,912,630 | 3/1990 | Cochcroft, Jr. | 364/200 |
| 5,126,975 | 6/1992 | Handy et al. | 365/230.01 |
| 5,384,745 | 1/1995 | Konishi et al. | 365/230.03 |
| 5,490,116 | 2/1996 | Tobita et al. | 365/226 |
| 5,491,663 | 2/1996 | Teel | 365/189.05 |
| 5,544,121 | 8/1996 | Dosaka et al. | 365/222 |
| 5,550,783 | 8/1996 | Stephens, Jr. et al. | 365/233 |
| 5,602,798 | * 2/1997 | Sato et al. | 365/233 |
| 5,604,884 | 2/1997 | Thome et al. | 395/494 |
| 5,787,489 | 7/1998 | Pawlowski | 711/169 |
| 5,809,549 | 9/1998 | Thome et al. | 711/167 |
| 5,848,431 | 12/1998 | Pawlowski | 711/5 |
| 6,009,494 | 12/1999 | Pawlowski | 711/5 |

OTHER PUBLICATIONS

Sony CXK77V3210Q Data Sheet, Rev. 14.0, Oct. 1995.
Horton, Thomas, "Selecting the Right Cache Architecture for High Performance PCS," Sony Semiconductor Company of America, San Jose, CA., Apr., 1995.
IBM Press Release. "IBM Introduces Fast 1–Megabit SRAM Family," Jun., 1994.
IBM Data Sheets, "IBM Burst SRAM," Mar. 31, 1998.
Izumikawa, Masanori et al., "A 400 MHz, 300mW, 8kb, CMOS SRAM Macro with a Current Sensing Scheme," Custom Integrated Circuits Conference, IEEE, Feb. 1994.

(List continued on next page.)

Primary Examiner—Tuan V. Thai
(74) Attorney, Agent, or Firm—Wells, St. John, Roberts, Gregory & Matkin, P.S.

(57) ABSTRACT

A synchronous SRAM comprising an SRAM core having a memory array of a plurality of bytes, having a plurality of byte write drivers, having sense amplifiers, and having I/O buffers; a plurality of byte write registers respectively connected to the write drivers, the byte write registers selectively activating corresponding byte write drivers to input data into the memory array during a write operation; a plurality of data inputs organized into bytes; a byte write enable input; a plurality of byte write inputs; and byte write enable circuitry connecting the byte write inputs and the byte write enable input to the byte write registers and selectively causing individual bytes of the data inputs to be written into the SRAM core when a predetermined asserted logic level is present on the byte write enable input and also depending on the asserted logic level on the individual byte write inputs.

16 Claims, 4 Drawing Sheets

OTHER PUBLICATIONS

Nakamura, Kazuyuki et al. "A 220 MHz Pipelined 16Mb BiCMOS SRAM with PLL Proportional Self–Timing Generator," Solid–State Circuits, 1994 41$^{st}$ Conference, Jul. 1994.

Dickinson, Alex, et al., "A Fast Pipelined CMOS SRAM," Tencon '92, IEEE Region 10 Conference, Nov. 1992.

Gowni, Shiva P., et al., "A 9NS, 32K X 9, BiCMOS TTL Synchronous Cache RAM with Burst Mode Access," Proceedings of the IEEE 1992 Custom Integrated Circuits Conference, May, 1992.

Hitachi America, Ltd., Semiconductor & I.C. Division, "Hitachi's Synchronous Burst, Pipelined 1Mbit (32Kx32) SRAM Meets Industry Demand for Economical, Fast Cache Memory Devices for Pentium PCs," Mar. 13, 1995.

"Microelectronics: Digital and Analog Circuits and Systems", J. Milliman, McGraw–Hill, Inc., pp. 290–291.

"Computer Hardware and Organization: An Introduction", M. E. Sloan, Science Research Associates, Inc., p. 343.

"The Cache Memory Book", Jim Handy, Academic Press, pp. 122, 201–205.

"Computer Organization and Design: The Hardware/Software Interface", Hennessy et al., Morgan Kaufmann Publishers, Inc. p. B–30.

Hitachi America, Ltd., Semiconductor & I.C. Division, "Hitachi's Synchronous Burst, Pipelined 1Mbit (32Kx32) SRAM Meets Industry Demand for Economical, Fast Cache Memory Devices for Pentium PCs", HM62C3232 SRAM, Internet: http://www.halsp.hitachi.com/news, Mar. 13, 1995.*

Millman, Jacob, "Microelectronics: Digital and Analog Circuits and Systems", McGraw–Hill, inc., pp. 290–291, 1979.*

Sloan, M. E., "Computer Hardware and Organization: An Introduction", Science Research Associates, Inc., p. 343, 1983.*

Handy, Jim, "The Cache Memory Book", Academic Press, pp. 122, 201–205, 1993.*

Hennessy et al., "Computer Organization and Design: The Hardware/Software Interface", Morgan Kaufmann Publishers, Inc., p. B–30, 1994.*

* cited by examiner

SYNCHRONOUS SRAM HAVING GLOBAL WRITE ENABLE

CROSS REFERENCE TO RELATED APPLICATION

This is a file wrapper continuation of U.S. patent application Ser. No. 08/540,581, filed Oct. 5, 1995, and titled "Synchronous SRAM Having Global Write Enable", now abandoned which in turn is a continuation-in-part of U.S. patent application Ser. No. 08/391,725, filed Feb. 21, 1997, and titled "Synchronous SRAMs Having Logic Circuitry for Memory Expansion", now U.S. Pat. No. 5,848,431.

CROSS REFERENCE TO RELATED APPLICATION

This application is a continuation-in-part of U.S. patent application Ser. No. 08/391,725, filed Feb. 21, 1995, titled "Synchronous SRAMs Having Logic Circuitry for Memory Expansion", assigned to Micron Technology, Inc. by inventor J. Thomas Pawlowski, and incorporated herein by reference.

TECHNICAL FIELD

This invention relates to synchronous SRAMs (Static Random Access Memories).

BACKGROUND OF THE INVENTION

Synchronous SRAMs are a type of SRAM that is registered and accessed in accordance with externally generated clock signals. The clock signal provides for synchronous operation of the SRAM. An SRAM is typically used as a cache. A cache is a small, fast redundant memory which duplicates frequently accessed information from a main memory, such as a DRAM.

One specific type of synchronous SRAMs is a synchronous burst SRAM which is designed in systems to achieve higher SRAM performance. Synchronous burst SRAMs have an internal counter which facilitates internal addressing of typically two to four addresses for each externally generated address that is loaded into the memory device. The internal "burst" addresses can be generated more rapidly in comparison to externally generating the same addresses and then loading them into the memory device using conventional techniques. Accordingly, the burst SRAMs operate faster and achieve higher performance. A pair of prior art synchronous SRAMs 100 and 102 connected to a 64 bit processor 104 is illustrated in FIG. 1.

The purpose of burst logic included in the above described synchronous burst SRAM is to facilitate cache line operations. A cache line is typically two or four times the data bus width. For example, in a system including a Pentium (TM) processor, the bus width is 64 bits (i.e.; 8 bytes), and the cache line size is 256 bits (i.e.; 32 bytes). Therefore, when a new cache line is read into or out of the SRAM in a system including a 64 bit processor, such as a Pentium (TM), four bus cycles are required, and a burst sequence of length four is employed. Burst sequences are discussed in greater detail below.

When it is desired to write to the SRAM 100 or 102, the processor 104 generates a byte enable signal on a byte enable line 106. The byte enable signal cannot be connected directly to the SRAM 100 or 102, however, because the byte enable signal from the processor does not distinguish between reads, writes, and other operations such as a snoop cycle.

(Snooping refers to the act of scanning bus activity to see if it is trying to modify information that is duplicated elsewhere. For example, something in cache is a duplicate of data in main memory. If a device tries to modify the data in main memory, it should also be modified in cache so that the data is coherent.)

Cache control logic 107 provides an interface between the synchronous burst SRAMs 100 and 102, and the processor. The cache control logic 107 is typically implemented in an ASIC (Application Specific Integrated Circuit).

In early SRAMs, one signal controlled writing to the SRAM. In later SRAMs, the write signal was split between bytes (e.g., upper byte and lower byte). A standard has thus developed with respect to control logic for synchronous burst SRAMs that requires one byte write input to the SRAM for every 8 or 9 bit width portion of the SRAM. The processor and the control logic both have an influence on the SRAM, and have different requirements of the SRAM.

A 64 bit processor 104, such as the Intel (TM) Pentium (TM), provides 8 byte enable outputs BE0#–BE7# (8 bits per byte). Because the byte enable signal cannot be connected directly to the SRAM 100 or 102, control logic 107 that interfaces a 64 bit processor requires 8 inputs, illustrated collectively as 108, to receive the 8 byte enable signals from the processor, and generates 8 byte write outputs, illustrated collectively as 110. The control logic thus has a total of 16 input/output (IO) lines. The control logic must be fast, making it difficult to implement all of this logic in an ASIC that operates at high frequencies.

The time required for a byte enable signal to travel from the processor into the control logic, propagate through the control logic, drive through output buffers in the control logic and into the SRAM can induce an extra wait state during write cycles. It would be easier to optimize fewer signals in the control logic ASIC 110.

It would therefore be desirable to reduce the number of input/output lines in the control logic ASIC 110.

Further, it is desirable and advantageous for synchronous burst SRAMs to facilitate a microprocessor-related function known as "address pipelining". In general, a processor attached to the synchronous burst SRAM outputs an address and data strobe signal each time a new address is ready for input into the SRAM device. On occasions, it may be desirable to delay execution of that new address. For example, in a synchronous burst SRAM, it might be desirable to continue the burst addressing operation before accepting the next external address. Accordingly, the synchronous burst SRAMs must be capable of blocking or delaying operation on the new address (as indicated by the address and data strobe signal from the processor) until the burst operation is completed.

BRIEF DESCRIPTION OF THE DRAWINGS

Preferred embodiments of the invention are described below with reference to the accompanying drawings, which are briefly described below.

Figure 1:
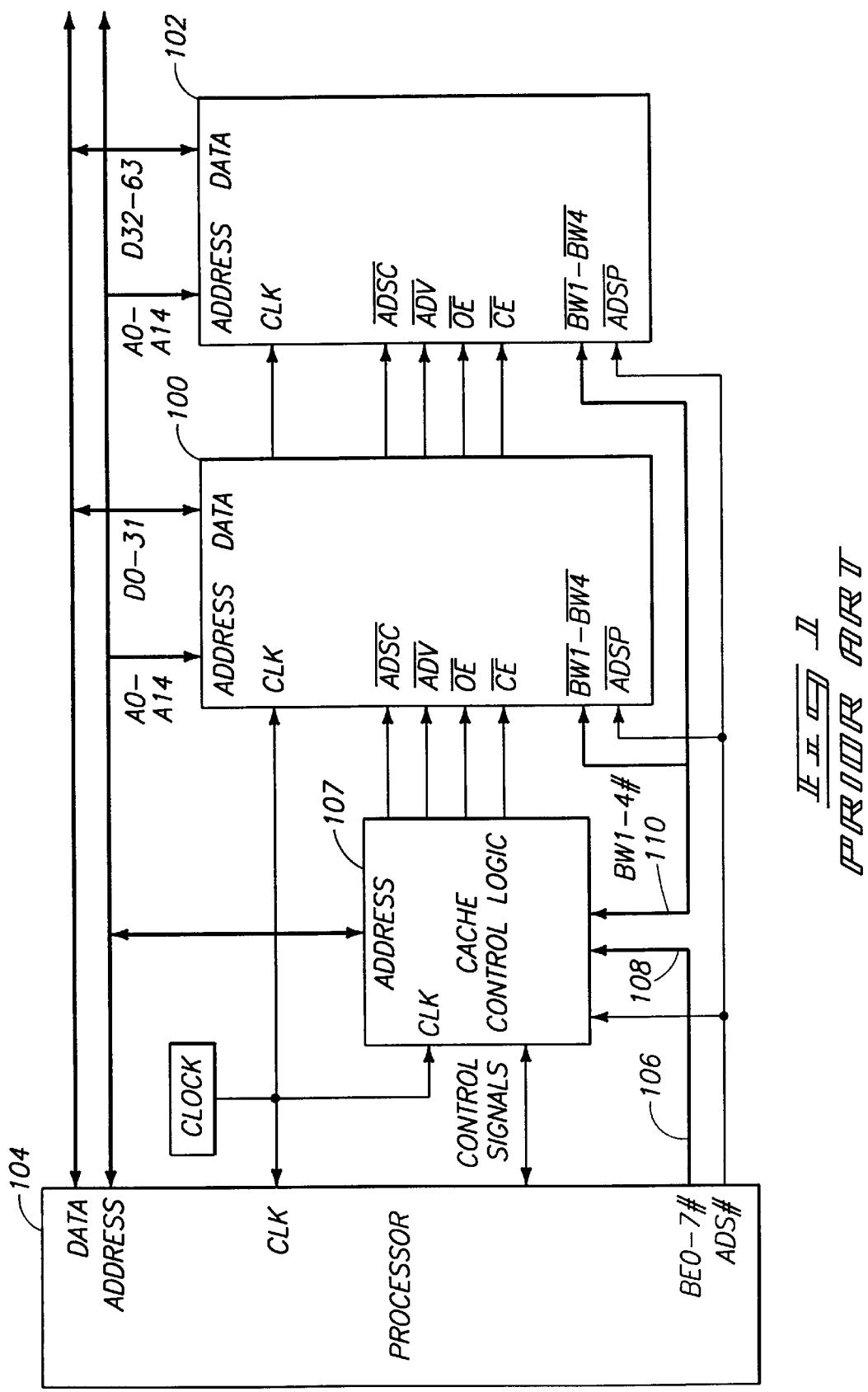
FIG. 1 is a block diagram of a prior art system showing interconnections between a 64 bit processor, cache control logic, and a pair of synchronous burst SRAMs.

In the drawings and detailed description, the symbol "#", or a bar over an input is used to indicate that a signal is an active low signal.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The synchronous SRAM of this invention includes global write circuitry, which allows a full bus width device write. The synchronous SRAM of this invention further includes individual byte write enable circuitry which allows partial bus write operations (writing of selected individual bytes) to the SRAM.

The synchronous SRAM of this invention also provides an If intermediate memory depth without use of external logic. The novel synchronous SRAM also includes a pipelining mode and a power down mode without expensive components or circuitry.

According to one aspect of this invention, a synchronous SRAM comprises an SRAM core having a memory array of a plurality of bytes, having a plurality of byte write drivers, having sense amplifiers, and having I/O buffers; a plurality of byte write registers respectively connected to the write drivers, the byte write registers selectively activating corresponding byte write drivers to input data into the memory array during a write operation; a plurality of data inputs organized into bytes; a byte write enable input; a plurality of byte write inputs; and byte write enable circuitry connecting the byte write inputs and the byte write enable input to the byte write registers and selectively causing individual bytes of the data inputs to be written into the SRAM core when a predetermined asserted logic level is present on the byte write enable input and also depending on the asserted logic level on the individual byte write inputs.

According to another aspect of the invention, a synchronous SRAM is provided comprising an SRAM core having a memory array of a plurality of bytes, having a plurality of byte write drivers, having sense amplifiers, and having I/O buffers; a plurality of byte write registers respectively connected to the write drivers, the byte write registers selectively activating corresponding byte write drivers to input data into the memory array during a write operation; a plurality of data inputs organized into bytes; a global write input; and global write circuitry connecting the global write input to the byte write registers and selectively forcing all bytes of the data inputs to be written into the SRAM core when a predetermined asserted logic level is present on the global write input.

Figure 2:
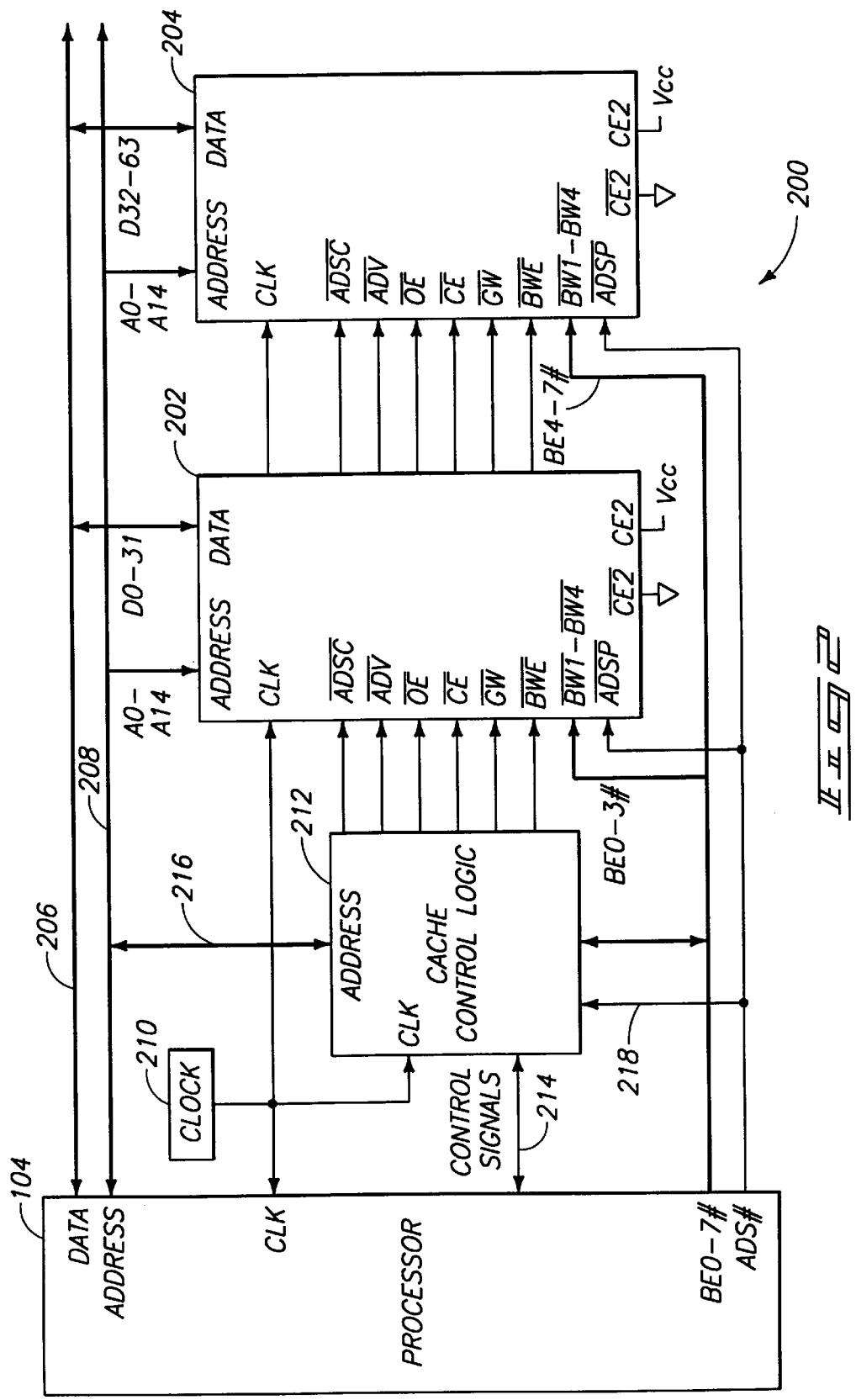
FIG. 2 is a block diagram of a system in accordance with the invention and showing interconnections between a 64 bit processor, cache control logic, and a pair of synchronous burst SRAMs.

FIG. 2 illustrates a system 200 including a processor 104 having a plurality of byte enable outputs BE0#–BE7#, an SRAM unit 202 having a plurality of byte write inputs $\overline{BW1}$–$\overline{BW4}$ connected directly to four of the byte enable outputs, namely to BE0#–BE3#, and an SRAM unit 204 having a plurality of byte write inputs $\overline{BW1}$–$\overline{BW4}$ connected directly to remaining byte enable outputs, namely BE4#–BE7#.

In the illustrated embodiment, the processor 104 is a 64 bit Pentium (TM) processor manufactured by Intel. However, the application has application to systems comprising any multiple byte processors. The processor 104 includes conventional inputs and outputs which are known in the art, and will not be discussed in detail. For example, the illustrated processor 104 includes data, address, clock, control signal, byte enable, and address status (ADS#) pins. The SRAM unit 202 and the SRAM unit 204 might both be 32 k×36 or 32 k×32 synchronous SRAMs. The system 200 includes a data bus 206 over which data is transferred between the SRAM units 202 and 204. The system 200 further includes an address bus 208 used for addressing. The system 200 also includes a clock 210 providing clock pulses to the processor 104, the SRAM unit 202, and the SRAM unit 204.

The system 200 further includes a cache control logic ASIC 212 which receives and sends control signals from and to the processor 104 over lines 214, which receives and sends addresses from and to the address bus 208 over lines 216, which receives address status signals from the processor over lines 218, and which provides various signals $\overline{ADSC}$, $\overline{ADV}$, $\overline{OE}$, $\overline{CE}$, $\overline{GW}$, and $\overline{BWE}$ (described below in greater detail) to the SRAM units 202 and 204.

Figure 3:
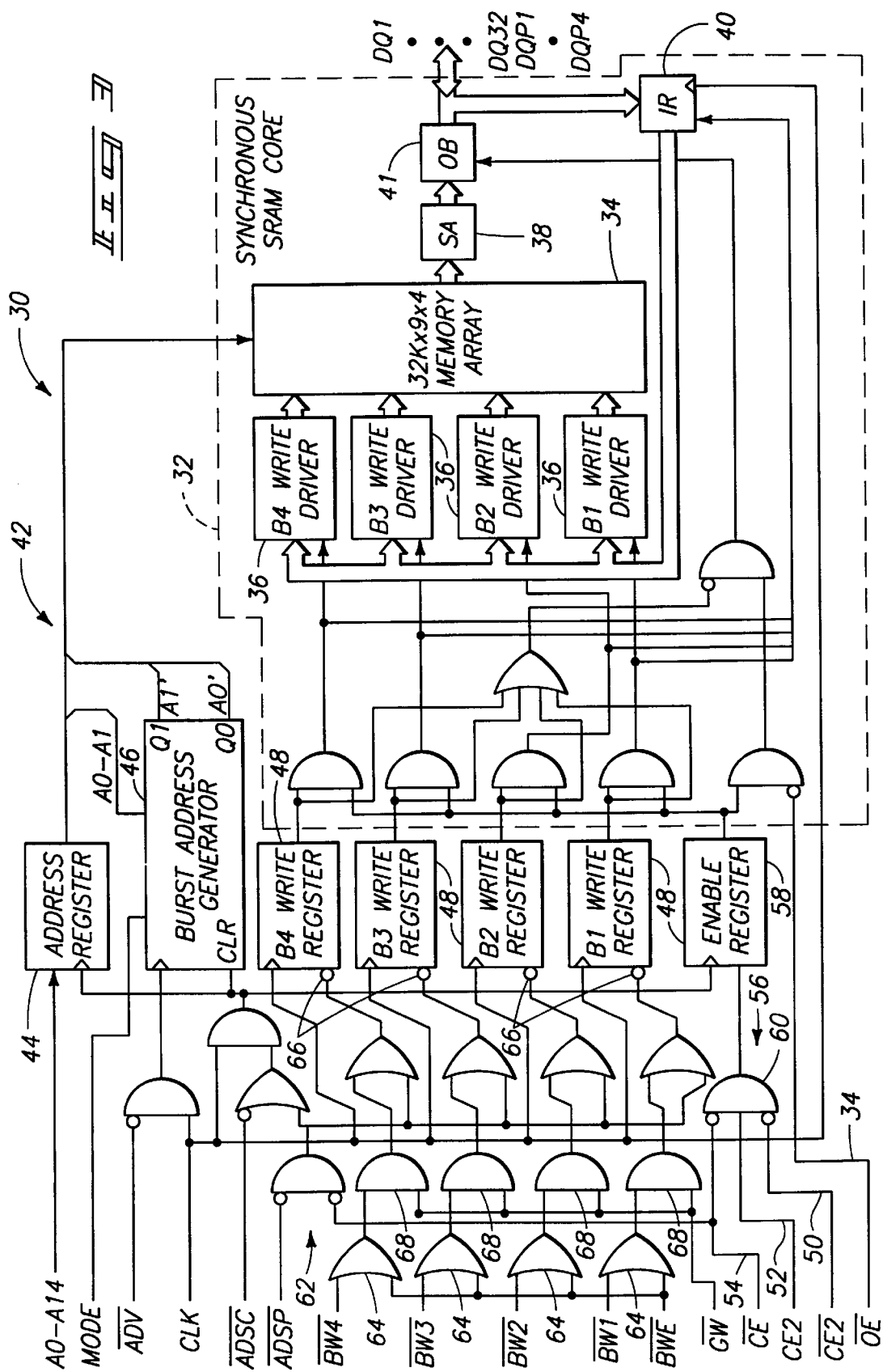
FIG. 3 is a block diagram of a synchronous burst SRAM device according to this invention. The invention is capable of embodiments comprising either a flow-through or pipelined SRAM device. A flow through SRAM device is shown in FIG. 3.

FIG. 3 shows a preferred construction of a synchronous burst SRAM device 30 which can be incorporated as one of the SRAM units 202 and 204 in system 200. Synchronous burst SRAM device 30 includes an SRAM core 32. Synchronous SRAM core 32 includes a memory array 34, and one or more byte write drivers 36 for temporarily holding data for input into the memory array 34. The byte write drivers 36, if enabled, drive data lines in the memory array 34 to appropriate levels for a write to occur. The synchronous SRAM core 32 further includes sense amplifiers 38, and I/O buffers (such as input registers 40 and output buffers 41 and optionally output registers) to facilitate transfer of data to and from the memory array. Input registers 40 take TTL (transistor-transistor logic) input and capture it at the rising edge of the clock signal CLK.

Address control circuitry 42 is coupled to SRAM core 32 for accessing a selected location in the memory array within the SRAM core. Preferably, address control circuitry 42 comprises an address register 44 for receiving externally generated addresses A0–A14 and a burst address generator 46 coupled to the address register 44 and to an externally generated mode signal (MODE). The mode signal selects the burst sequence for compatibility with different types of processors 104. If MODE is low, a linear burst sequence is selected for compatibility with a PowerPC (TM) processor; otherwise, an interleaved burst mode is selected for compatibility with an Intel (TM) processor. The burst address generator 46 rapidly generates additional internal addresses using at least one, and preferably two or more, address bits stored in the address register. In this construction, burst address generator 46 comprises a two bit binary counter or other equivalent logic which employs the two least significant bits (LSB) A0 and A1 to generate additional addresses internally at a much higher rate as compared to external generation of the same addresses.

The SRAM device 30 includes a synchronous address advance input $\overline{ADV}$. In the illustrated embodiment, the synchronous address advance input $\overline{ADV}$ is an active low input which is coupled to the burst address generator 46 and which is used to advance the counter in the burst address generator 46. If the address advance input $\overline{ADV}$ is high, wait states are generated; if the address advance input $\overline{ADV}$ is low, and a new external address is not being loaded, an address advance takes place. If the linear burst mode is selected, a simple binary up counter sequence is followed with any overflow of the counter ignored. Only the least significant bits A0 and A1 are affected. A sample counting sequence is 00, 01, 10, 11, followed by a wrap (discarding overflow) to 01, then 10, 11, 00, etc. If starting with 10, the advances would be to 11, 00, 01, etc. If starting with 11, the advances would be to 00, 01, 10, etc. If the interleaved burst is selected, the least significant bits A0 and A1 are advanced using a formula:

initial sequence=A1 A0, next=A1 $\overline{A0}$, next=$\overline{A1}$ A0, next=$\overline{A1}$ $\overline{A0}$ Sample sequences are:

00, 01, 10, 11 (same as the linear sequence starting with 00)
01, 00, 11, 10 (different from the linear sequence starting with 01)
10, 11, 00, 10 (same as the linear sequence starting with 10)
11, 10, 01, 00 (different from the linear sequence starting with 11).

Synchronous burst SRAM device 30 has multiple one-bit "byte write" registers 48 which activate corresponding write drivers 36 to input data into the memory array 34 during a write operation. When write registers 48 hold one binary bit, such as a "1", write drivers 36 are enabled to transfer data to memory array 34; whereas, when write registers 48 hold the other binary bit, such as a "0", the write drivers are not enabled indicating that a read operation is being performed. The write registers 48 are controlled by signals on respective synchronous byte write inputs $\overline{BW1}$, $\overline{BW2}$, $\overline{BW3}$, and $\overline{BW4}$ and a clock input signal CLK. The operation of write registers 48 is also partially controlled by the logical combination of the module enable signal $\overline{CE}$ and an external address signal $\overline{ADSP}$. In this embodiment, the external address signal is in the form of an address and data strobe from the processor 104 which indicates that an external address is ready to be loaded into address register 44. In the illustrated embodiment, the byte write inputs $\overline{BW1}$, $\overline{BW2}$, $\overline{BW3}$, and $\overline{BW4}$ are active low inputs.

The SRAM device 30 further includes a byte write enable input $\overline{BWE}$. The SRAM device 30 further includes byte write enable circuitry which allows partial bus write operations (writing of selected individual bytes) to the SRAM device 30 depending on the asserted logic level of the byte write enable input $\overline{BWE}$. In the illustrated embodiment, the byte write enable input $\overline{BWE}$ is an active low input. The byte write enable circuitry comprises a plurality of OR gates 64. The SRAM device 30 further includes invertors 66 associated with respective byte write registers 48. The OR gates 64 respectively have a first input connected to the byte write enable input $\overline{BWE}$, a second input connected to one of the byte write inputs $\overline{BW1}$, $\overline{BW2}$, $\overline{BW3}$ and $\overline{BW4}$, and an output connected to a corresponding one of the byte write registers 48, via one of the invertors 66. If the byte write inputs and byte write enable input were active high inputs, then AND gates would be substituted for the OR gates 64, and the invertors 66 would be omitted.

Because of the provision of the byte write enable circuitry, individual bytes can be written using $\overline{BW1}$, $\overline{BW2}$, $\overline{BW3}$, and $\overline{BW4}$. $\overline{BW1}$ controls a byte defined by data bits DQ1–DQ8, $\overline{BW2}$ controls a byte defined by data bits DQ9–DQ16, $\overline{BW3}$ controls a byte defined by data bits DQ17–DQ24 and DQP3, and $\overline{BW4}$ controls a byte defined by data bits DQ25–DQ32 and DQP4, conditioned on $\overline{BWE}$ being low.

The SRAM device 30 includes a global write input $\overline{GW}$. The SRAM device 30 further includes global write circuitry, which forces all bytes to be written into the SRAM (a full bus width device write; e.g., a full 32-bit write), independent of the $\overline{BWE}$, $\overline{BW1}$, $\overline{BW2}$, $\overline{BW3}$ and $\overline{BW4}$ inputs, depending on the asserted logic level of the $\overline{GW}$ input. In the illustrated embodiment, the $\overline{GW}$ input is an active low input. When $\overline{GW}$ is low, all bytes are written. The global write circuitry comprises a plurality of AND gates 68. The AND gates 68 respectively have a first input connected to the global write input $\overline{GW}$, a second input connected to one of the byte write inputs $\overline{BW1}$, $\overline{BW2}$, $\overline{BW3}$ and $\overline{BW4}$ (more particularly, to the output of one of the OR gates 64), and an output connected to a corresponding one of the byte write registers 48, via one of the invertors 66. If the byte write inputs and byte write enable input were active high inputs, then OR gates would be substituted for the AND gates 68, and the invertors 66 would be omitted.

The remaining inputs to the SRAM device 30 include: an address advance signal input, $\overline{ADV}$, which is used to increment the binary counter in the burst address generator 46; a synchronous address status processor input $\overline{ADSP}$; a synchronous address status controller input, $\overline{ADSC}$; three chip enable inputs, $\overline{CE2}$, CE2, and $\overline{CE}$; and an output enable input $\overline{OE}$. In the illustrated embodiment, the address advance signal input $\overline{ADV}$, the synchronous address status processor input $\overline{ADSP}$, the synchronous address status controller input, $\overline{ADSC}$, chip enable inputs $\overline{CE2}$, and $\overline{CE}$, and the output enable input $\overline{OE}$, are all active low inputs, and the chip enable input CE2 is an active high input.

The synchronous address status processor input $\overline{ADSP}$ is used to interrupt any ongoing burst, and causes a new external address to be registered. A read operation is performed using the new address, independent of the values of the signals at $\overline{BW1}$, $\overline{BW2}$, $\overline{BW3}$, $\overline{BW4}$, $\overline{GW}$, and $\overline{BWE}$, and independent of the values of the signal at the input $\overline{ADSC}$, but dependent on the values of the signals at the inputs CE2 and $\overline{CE2}$. $\overline{ADSP}$ is ignored if $\overline{CE}$ is high.

The synchronous address status controller input $\overline{ADSC}$ is used to interrupt any ongoing burst, and causes a new external address to be registered. A read operation is performed using the new address, unless a write is indicated by the values of the signals at $\overline{BW1}$, $\overline{BW2}$, $\overline{BW3}$, $\overline{BW4}$, $\overline{GW}$, and $\overline{BWE}$, in which case a write is performed, but either operation is dependent on the values of the signal at the inputs CE2, $\overline{CE2}$, and $\overline{CE}$.

The SRAM device 30 includes various logic gates (such as AND and OR gates), connecting the above discussed components in a conventional manner, which will not be discussed herein in any detail.

When the SRAM device 30 of FIG. 3 is used as SRAM unit 202, and another SRAM device 30 of FIG. 3 is used as SRAM unit 204 in the system 200 of FIG.2, only the byte write enable signal $\overline{BWE}$ needs to be speed optimized in the control logic 212. This is in contradistinction to prior art control logic ASICs, for which processor byte enable outputs BE0#–BE7# would all have to propagate through the logic of the ASIC and to the SRAM. The design of the SRAM device 30 permits direct connection of the byte enable outputs BE0#–BE7# from the processor 104 to the SRAM 202 and SRAM 204.

As in prior art control logic ASICs, the control logic 212 validates whether current cycle will operate on the SRAM 202 or 204. More particularly, the control logic 212 determines if this is a valid cycle for passing data to the SRAM 202. If the control logic 212 determines that this is a write cycle, and if there is data to cache ("cache hit"), and if a processor byte enable output BE0#–BE7# is low, then a low $\overline{BWE}$ signal is produced by the control logic 212 and applied to the SRAM 202 or 204. The SRAM 202 receives low signals at each byte write input, $\overline{BW1}$, $\overline{BW2}$, $\overline{BW3}$, and $\overline{BW4}$, for which a low signal is present at the corresponding processor byte enable output BE0#–BE7#.

In alternative embodiments (not shown), the SRAM memory array 34 is sized appropriately for use in other multiple byte systems such as 64, or 128 bit systems. In such embodiments, the memory array 34 has widths of 8 or 16 bytes, respectively, instead of 4 bytes.

In other alternative embodiments, the memory array 34 is half as wide and twice as tall as the array shown in FIG. 3. In such embodiments, there are only 2 byte write drivers, 2 byte write inputs, etc.

In yet other alternative embodiments, the memory array 34 is 64 bits wide. In such embodiments, there are 8 byte write drivers, 8 byte write inputs, etc.

Figure 4:
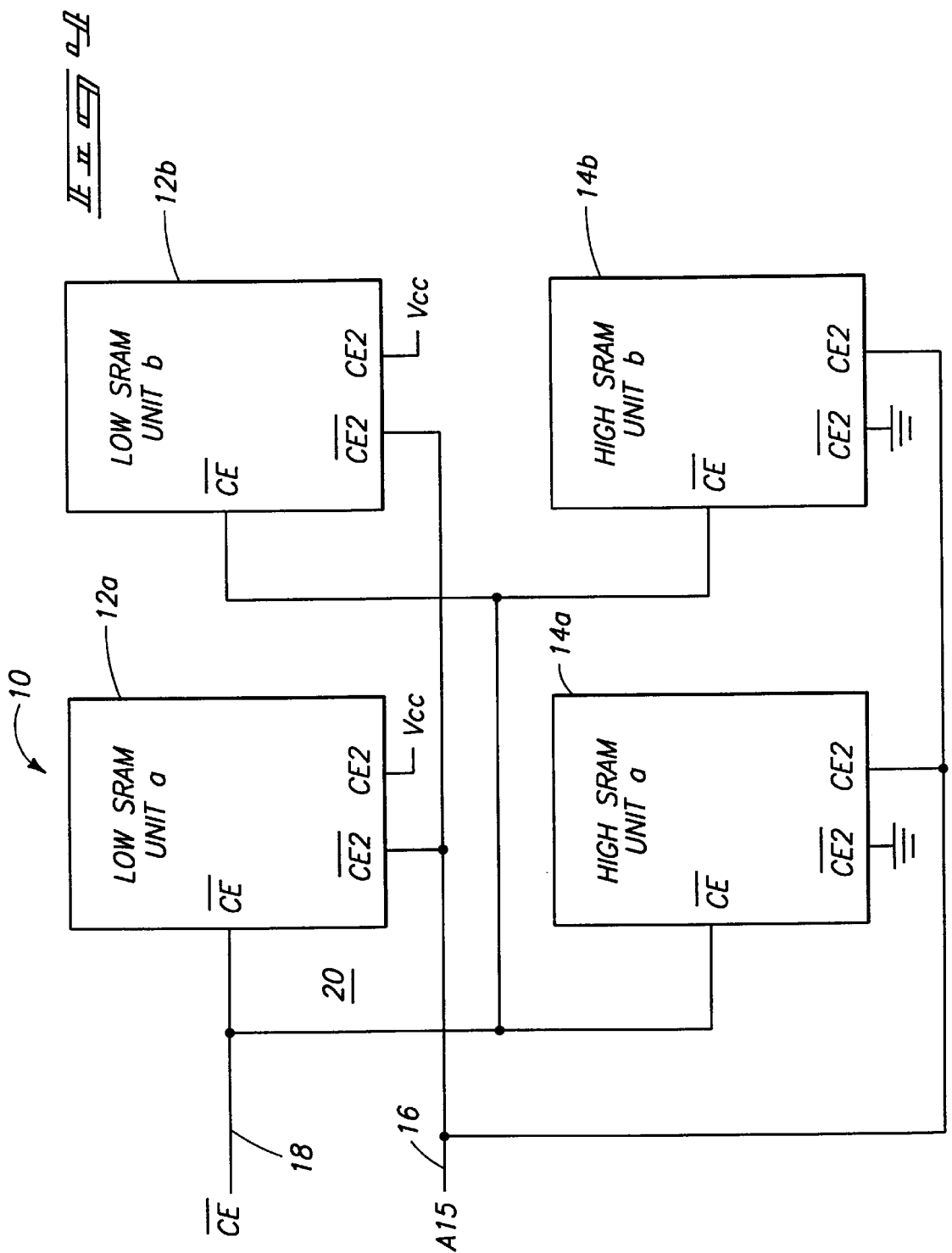
FIG. 4 is an SRAM module including two pairs of SRAMs such as the SRAMs shown in FIG. 3.

FIG. 4 illustrates how depth expansion is accomplished using additional SRAM units and chip enable inputs, $\overline{CE2}$, CE2, and $\overline{CE}$ of the SRAM units. More particularly, FIG. 4 illustrates a synchronous SRAM module 10 designed to provide an intermediate-sized memory device. The SRAM module 10 includes first (or low) SRAM units 12a and 12b of a common memory size and second (or high) SRAM units 14a and 14b of a common memory size which are stacked together to effectively double the memory capacity. For example, first SRAM units 12a and 12b, and second SRAM units 14a and 14b might each be 32 k×32 synchronous SRAMs substantially identical in construction to the SRAM device 30 shown in FIG. 3, except with a 32 k×32 memory array instead of the 32 k×36 memory array 34 illustrated in FIG. 3. When the first SRAM units 12a and 12b are coupled together with the second SRAM units 14a and 14b as shown in FIG. 4, a 64 k×64 synchronous SRAM module 10 is formed.

Each of the SRAM units 12a, 12b, 14a, and 14b are equipped with three chip enable inputs. The three chip enable inputs are advantageous over prior art designs in that they serve the dual tasks of permitting selection of either the first SRAM units 12a and 12b or the second SRAMs units 14a and 14b, while also providing a means for powering down or disabling both the first SRAM units 12a and 12b, and the second SRAM units 14a and 14b simultaneously.

More particularly, each SRAM unit 12a, 12b, 14a and 14b has a first chip enable input $\overline{CE2}$, a second chip enable input CE2, and a third chip enable input $\overline{CE}$. The first chip enable inputs $\overline{CE2}$ of first SRAM units 12a and 12b, and the second chip enable inputs CE2 of second SRAM units 14a and 14b, are tied together to receive a memory select enable signal over conductor 16. In a system, conductor 16 is frequently an address line. The second chip enable inputs CE2 of the first SRAM units 12a and 12b are connected to power $V_{CC}$, and the first chip enable inputs $\overline{CE2}$ of the second SRAM units 14a and 14b are connected to ground.

According to this circuit construction, the memory select enable signal applied over conductor 16 operably chooses between the first SRAM units 12a and 12b, and the second SRAM units 14a and 14b according to the asserted logic level of the signal. When the memory select enable signal is at one asserted logic level (e.g.; low), first SRAM units 12a and 12b are chosen. Conversely, second SRAM units 14a and 14b are selected when the memory select enable signal is at another asserted logic level (e.g.; high). In the preferred embodiment, the memory select enable signal is a bit in an address used to access the memory arrays in the first SRAM units 12a and 12b, or the second SRAM units 14a and 14b. As illustrated in FIG. 4, the most significant bit (MSB) A15 is used as the memory select enable signal to operably choose between the first SRAM units 12a and 12b, and the second SRAM units 14a and 14b.

A module enable signal $\overline{CE}$ is coupled via conductor 18 to the third chip enable input $\overline{CE}$ of the SRAM units 12a, 12b, 14a, and 14b. The module enable signal enables operation of all SRAM units 12a, 12b, 14a, and 14b when the signal is at one asserted logic level (e.g.; low), and disables operation of both SRAM units when the module enable signal is at another asserted logic level (e.g.; high). Memory module 10 of this invention is therefore advantageous over prior art designs in that it permits the entire module (comprising multiple SRAM units) to be completely powered down.

The illustrated coupling arrangement for stacking first SRAM units 12a and 12b, and second SRAM units 14a, and 14b is one preferred construction of a module enable and memory selection circuit 20 which in part controls operation of the synchronous SRAM module 10. It should be noted that other coupling arrangements defining circuit 20 can be used. For example, conductor 16 can be coupled to the second chip enable inputs CE2 of the first SRAM units 12a and 12b, and to the first chip enable inputs $\overline{CE2}$ of the second SRAM units 14a and 14b. In this alternative construction, the first chip enable inputs $\overline{CE2}$ of the first SRAM units 12a and 12b would be connected to ground, and the second chip enable inputs CE2 of the second SRAM units 14a and 14b would be connected to power.

For purposes of continuing discussion, assume that synchronous burst SRAM device 30 shown in FIG. 3 is used as the SRAM unit 12a in the SRAM module 10 of FIG. 4. As shown in FIG. 4, the first chip enable input $\overline{CE2}$ (referenced by numeral 50 in FIG. 3) is coupled to receive the MSB A15, the second chip enable input CE2 (referenced by numeral 52) is tied to power $V_{CC}$, and the third chip enable input $\overline{CE}$ (referenced by numeral 54) is connected to receive the module enable signal.

Synchronous burst SRAM device 30 also includes chip enable and select logic 56 coupled to the three chip enable inputs 50, 52, and 54. The chip enable and select logic 56 performs the dual functions of (1) selectively enabling or disabling the synchronous burst SRAM device, and (2) selectively permitting access to the SRAM core 32 when the SRAM device is enabled. These functions are achieved based upon a boolean function of the signals at the three chip enable inputs. The chip enable and select logic 56 generates an SRAM core enable signal for enabling SRAM core 32 as a result of the boolean function provided by logic 56. A one-bit enable register 58 is coupled between the chip enable and select logic 56 and the SRAM core 32 for temporarily storing the SRAM core enable signal. In this manner, the SRAM core is merely responsive to a single enable signal held in register 58, although this single core enable signal is generated according to a relationship among the three chip enable signals to the entire SRAM device.

In the preferred form, chip enable and select logic 56 comprises an AND gate 60 having three inputs coupled to the three chip enable inputs 50, 52, 54 and an output coupled to enable register 58.

SRAM device 30 also includes address pipelining logic 62 which is coupled to at least one of the three chip enable inputs, and more specifically, to the third chip enable input 54. Pipelining logic 62 is provided to block the external address signal $\overline{ADSP}$ from notifying the chip that an external address is waiting to be loaded into the address register. This signal blocking function permits the synchronous burst SRAM device to operate in a pipelining mode. An example operation in the pipelining mode is to allow the burst address generator 46 to generate multiple additional addresses without interference from an external address as indicated by the external address signal $\overline{ADSP}$.

The pipelining logic 62 comprises a NOR gate having one input tied to the processor produced address and data strobe $\overline{ADSP}$ and one input coupled to the module enable signal at third chip enable input 54. In this manner, when the module enable signal at input 54 is at a selected asserted logic level (e.g.; high), pipelining logic 62 blocks the external address signal $\overline{ADSP}$ from affecting operation of the SRAM device to thereby permit pipelining operation.

Chip enable and select logic 56, enable register 58, and pipelining logic 62 thereby provide device control circuitry for performing three desired functions: (1) selectively enabling or disabling the SRAM device, (2) selectively permitting access to the SRAM core when the SRAM device is enabled, and (3) selectively permitting pipelining operation of the SRAM device. The circuitry arrangement of this invention achieves these desired features, as well as the above described global write and byte write features, without introducing additional external logic or circuitry. Additionally, this invention accomplishes these desired results through the use of inexpensive logic design comprised of a few logical gates and registers.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A system comprising:
    a processor having a plurality of byte enable outputs;
    cache control logic connected to the processor; and
    a synchronous SRAM connected to the cache control logic and to the processor, the SRAM including:
        an SRAM core having a memory array of a plurality of bytes, wherein individual bytes are selectably written to, but multiple bytes are simultaneously selected when it is desired to read from the bytes, for improved speed, the SRAM core further having a plurality of byte write drivers, having sense amplifiers, and having I/O buffers;
        a plurality of byte write registers respectively connected to the write drivers, the byte write registers selectively activating corresponding byte write drivers to input data into the memory array during a write operation;
        a plurality of data inputs organized into bytes and connected to the processor;
        a byte write enable input connected to the cache control logic;
        a plurality of byte write inputs respectively directly connected to the byte enable outputs of the processor;
        byte write enable circuitry connecting the byte write inputs and the byte write enable input to the byte write registers and selectively causing individual bytes of the data inputs to be written into the SRAM core when a predetermined asserted logic level is present on the byte write enable input and also depending on the asserted logic level on the individual byte write inputs;
        ony a global write input selectively causing all bytes of the data inputs to be written into the SRAM core when a predetermined asserted logic level is present on the global write input, the global write input being connected to the cache control logic; and
        global write circuitry connecting the global write input to the byte write registers.

2. A system in accordance with claim 1 wherein predetermined byte write inputs are associated with predetermined bytes of the data inputs so that predetermined bytes of the data inputs can be selected using individual byte write inputs.

3. A system in accordance with claim 1 wherein the data inputs are organized into a predetermined number of bytes, and wherein the number of byte write registers is equal to this predetermined number of bytes.

4. A system in accordance with claim 1 wherein the SRAM further comprises first, second, and third chip enable inputs, wherein the system further comprises:
    a second SRAM having a memory array and control circuitry for accessing the memory array of the second SRAM, the second SRAM having first, second, and third chip enable inputs;
    a module enable and memory selection circuit operably connected to selectively enable or disable both SRAMs and to choose one of the first and second SRAMs for access, the memory module enable and memory selection circuit generating a module enable signal and a memory select enable signal;
    the memory select enable signal being connected to at least one of the first and second chip enable inputs of the first and second SRAMs for selecting the first SRAM when the memory select enable signal is at one asserted logic level and for selecting the second SRAM when the memory select enable signal is at another asserted logic level; and
    the module enable signal being connected to the third chip enable inputs of the first and second SRAMs for enabling operation of both SRAMs when the module enable signal is at one asserted logic level and for disabling operation of both SRAMs when the module enable signal is at another asserted logic level.

5. A system in accordance with claim 4 wherein:
    the memory select enable signal is connected to the first chip enable input of the first SRAM and to the second chip enable input of the second SRAM;
    the second chip enable input of the first SRAM is connected to power; and
    the first chip enable input of the second SRAM is connected to ground.

6. A system comprising:
    a processor;
    cache control logic connected to the processor; and
    a synchronous SRAM connected to the cache control logic and to the processor, the SRAM including:
        an SRAM core having a memory array of a plurality of bytes, having a plurality of byte write drivers, having sense amplifiers, and having I/O buffers;
        a plurality of byte write registers respectively connected to the write drivers, the byte write registers selectively activating corresponding byte write drivers to input data into the memory array during a write operation;
        a plurality of data inputs organized into bytes and connected to the processor;
        a global write input connected to the cache control logic;
        global write sway circuitry connecting the global write input to the byte write registers and selectively causing all bytes of the data inputs to be written into the SRAM core when a predetermined asserted logic level is present on the global write input; and a byte write enable input, a plurality of byte write inputs, and byte write enable circuitry connecting the byte write inputs and the byte write enable input to the byte write registers and selectively causing individual bytes of the data inputs to be written into the SRAM core when a predetermined asserted logic level is present on the byte write enable input and also depending on the asserted logic level on the individual byte write inputs, wherein individual bytes are selectably written to, but multiple bytes are simultaneously selected when it is desired to read from the bytes.

7. A system in accordance with claim 6 wherein predetermined byte write inputs are associated with predetermined bytes of the data inputs so that predetermined bytes of the data inputs can be selected using individual byte write inputs.

8. A system in accordance with claim 6 wherein the data inputs are organized into a predetermined number of bytes, and wherein the number of byte write registers is equal to this predetermined number of bytes.

9. A system in accordance with claim 6 wherein the SRAM further comprises first, second, and third chip enable inputs, wherein the system further comprises:
  a second SRAM having a memory array and control circuitry for accessing the memory array of the second SRAM, the second SRAM having first, second, and third chip enable inputs;
  a module enable and memory selection circuit operably connected to selectively enable or disable both SRAMs and to choose one of the first and second SRAMs for access, the memory module enable and memory selection circuit generating a module enable signal and a if memory select enable signal;
  the memory select enable signal being connected to at least one of the first and second chip enable inputs of the first and second SRAMs for selecting the first SRAM when the memory select enable signal is at one asserted logic level and for selecting the second SRAM when the memory select enable signal is at another asserted logic level; and
  the module enable signal being connected to the third chip enable inputs of the first and second SRAMs for enabling operation of both SRAMs when the module enable signal is at one asserted logic level and for disabling operation of both SRAMs when the module enable signal is at another asserted logic level.

10. A system in accordance with claim 9 wherein:
  the memory select enable signal is connected to the first chip enable input of the first SRAM and to the second chip enable input of the second SRAM;
  the second chip enable input of the first SRAM is connected to power; and
  the first chip enable input of the second SRAM is connected to ground.

11. A synchronous SRAM comprising:
  an SRAM core having a memory array of a plurality of bytes, having a plurality of byte write drivers, having sense amplifiers, and having I/O buffers;
  a plurality of data inputs organized into bytes;
  a plurality of byte write registers respectively connected to the write drivers, the byte write registers selectively activating corresponding byte write drivers to input data into the memory array;
  a byte write enable input;
  a plurality of byte write inputs;
  byte write enable circuitry connecting the byte write inputs and the byte write enable input to the byte write registers and selectively causing individual bytes of the data inputs to be written into the SRAM core when a predetermined asserted logic level is present on the byte write enable input and also depending on the asserted logic level on the individual byte write inputs; and
  a global write input, and global write circuitry connecting the global write input to the byte write registers, all bytes of the data inputs being written into the SRAM core in response to a predetermined asserted logic level being present on the global write input, without need for assertion of a predetermined logic level on another input to cause all bytes of the data inputs to be written into the SRAM core.

12. A synchronous SRAM in accordance with claim 11 wherein predetermined byte write inputs are associated with predetermined bytes of the data inputs so that predetermined bytes of the data inputs can be selected using individual byte write inputs.

13. A system comprising:
  a processor including a plurality of byte enable outputs;
  control logic communicating with the processor;
  a first synchronous SRAM communicating with the processor and the control logic, the first SRAM comprising:
    an SRAM core having a memory array, write drivers, sense amplifiers, and I/O buffers;
    address control circuitry for accessing a selected location of the memory array within the SRAM core;
    a plurality of byte write registers respectively connected to the write drivers, the byte write registers selectively activating corresponding byte write drivers to input data into the memory array during a write operation;
    a plurality of data inputs organized into bytes;
    is a byte write enable input;
    a plurality of byte write inputs respectively directly connected to the byte enable outputs of the processor;
    byte write enable circuitry connecting the byte write inputs and the byte write enable input to the byte write registers and selectively causing individual bytes of the data inputs to be written into the SRAM core when a predetermined asserted logic level is present on the byte write enable input and also depending on the asserted logic level on the individual byte write inputs, wherein individual bytes are selectably written to, but multiple bytes are simultaneously selected when it is desired to read from the bytes;
    a global write input, and global write only circuitry connecting the global write input to the byte write registers and selectively causing all bytes of the data inputs to be written into the SRAM core when a predetermined asserted logic level is present on the global write input, without need for assertion of a predetermined logic level on any other input to cause all bytes of the data inputs to be written into the SRAM core;
    first, second, and third chip enable inputs for receiving at least a module enable signal and a memory select enable signal;
    a device control circuit connected to the SRAM core and the chip enable inputs, the device control circuit performing the dual functions of selectively enabling or disabling the first SRAM and selectively permitting access to the SRAM core when the first SRAM is enabled in accordance with the module enable signal and the memory select enable signal; and a second synchronous SRAM communicating with the processor and the control logic, the second SRAM comprising:
an SRAM core having a memory array, write drivers, sense amplifiers, and I/O buffers;
address control circuitry for accessing a selected location of the memory array within the SRAM core;
first, second, and third chip enable inputs for receiving at least the module enable signal and a memory select enable signal;
a device control circuit connected to the SRAM core and the chip enable inputs, the device control circuit performing the dual functions of selectively enabling or disabling the second SRAM and selectively permitting access to the SRAM core when the second SRAM is enabled in accordance with the module enable signal and the memory select enable signal;

the memory select enable signal selecting the first SRAM when the memory select enable signal is at one asserted logic level and selecting the second SRAM when the memory select enable signal is at another asserted logic level; and the module enable signal enabling operation of both SRAMs when the module enable signal is at one asserted logic level and disabling operation of both SRAMs when the module enable signal is at another asserted logic level.

14. A system in accordance with claim 13 wherein predetermined byte write inputs of the first SRAM are associated with predetermined bytes of the data inputs of the first SRAM so that predetermined bytes of the data inputs can be selected using individual byte write inputs.

15. A system in accordance with claim 13 wherein the processor is a 64 bit processor, wherein the data inputs of the first SRAM are organized into four bytes, and wherein the first SRAM has exactly four byte write registers.

16. A system in accordance with claim 13 wherein the byte write inputs, the global write input, and the byte write enable inputs are active low inputs, wherein the byte write enable circuitry comprises a plurality of OR gates having first inputs respectively connected to the byte write inputs, wherein the OR gates also have second inputs connected to the byte write enable input, wherein the OR gates have respective outputs, wherein the global write circuitry comprises a plurality of AND gates having first inputs respectively connected to the outputs of the OR gates, wherein the AND gates also have second inputs connected to the global write input, wherein the AND gates have respective outputs which are respectively inverted then connected to respective byte write registers.

* * * * *

UNITED STATES PATENT AND TRADEMARK OFFICE
CERTIFICATE OF CORRECTION

PATENT NO. : 6,205,514 B1  Page 1 of 1
DATED : March 20, 2001
INVENTOR(S) : J. Thomas Pawlowski It is certified that error appears in the above-identified patent and that said Letters Patent is hereby corrected as shown below:

Column 3,
Line 24, replace "an If intermediate" with -- an intermediate --.

Column 5,
Line 10, replace "AO" with -- $\overline{AO}$ --.

Column 11,
Line 33, delete "if" at end of sentence.

Column 12,
Line 38, replace "is a byte" with -- a byte --.

Signed and Sealed this

Twenty-first Day of August, 2001

Attest:

*Nicholas P. Godici*

NICHOLAS P. GODICI
*Attesting Officer*    Acting Director of the United States Patent and Trademark Office